United States Patent [19]

Sagawa et al.

[11] Patent Number: 4,933,601

[45] Date of Patent: Jun. 12, 1990

[54] LIGHT EMITTING DIODE ARRAY CHIP AND METHOD OF FABRICATING SAME

[75] Inventors: Toshio Sagawa, Hitachi; Kazuhiro Kurata, Hachiouji, both of Japan

[73] Assignee: Hitachi Cable Limited, Tokyo, Japan

[21] Appl. No.: 282,175

[22] Filed: Dec. 9, 1988

[30] Foreign Application Priority Data

Dec. 9, 1987 [JP] Japan ............................... 62-309595

[51] Int. Cl.⁵ ..................... H01L 21/20; H01L 31/12
[52] U.S. Cl. ..................................... 313/500; 357/17; 437/23
[58] Field of Search ................. 313/499, 500; 357/17, 357/23; 437/23, 91, 92, 127, 130, 133

[56] References Cited

U.S. PATENT DOCUMENTS

| | | | |
|---|---|---|---|
| 3,697,336 | 10/1972 | Lamorte | 437/91 |
| 4,404,730 | 9/1983 | Heimen | 437/91 |
| 4,801,993 | 1/1989 | Ankri et al. | 357/17 X |

*Primary Examiner*—Sandra L. O'Shea
*Attorney, Agent, or Firm*—Dykema Gossett

[57] ABSTRACT

An LED array chip comprising; a first semiconductor layer having p-type conduction; a second semiconductor layer having a n-type conduction, possessing forbidden band width smaller than the first layer and provided on the first layer, so as to form a semiconductor chip having a pn junction at the interface with the first layer; the second layer being divided into a first region and a second region by etching the second layer through to the pn junction, the first region thereof being divided to form individual plural LEDs of predetermined configuration, and the n-type layer in the second region being converted to the p-type layer as so to serve as a common region; individual electrodes respectively provided to the surfaces of the LEDs; and a common electrode provided to the common region, parts of the exposed surface of the p-type layer corresponding to the LEDs serving as light emitting surfaces. The LED array chip is mounted on a printed circuit board by directly bonding the individual electrodes and the common electrode to the corresponding electrode pads of the printed circuit.

20 Claims, 5 Drawing Sheets

LIGHT EMITTING DIODE ARRAY CHIP AND METHOD OF FABRICATING SAME

BACKGROUND OF THE INVENTION

1. Technical Field

The present invention relates to a light emitting diode array chip (hereinafter, referred to as "LED array chip") and a method of fabricating same and deals, more specifically with improvements in the electrode construction of a LED array chip.

2. Background Art

The LED array chip has been used as an active component of optical printers and image reading apparatus. The recent development of LEDs having an increased output capacity have entailed the replacement of semiconductor lasers, which have been most generally used in optical printers, by LEDs. This trend is a natural result of the advancement of information processing technology and communications technology requiring compact, inexpensive electrophotographic printers capable of producing a large number of paper sheets printed with arbitrary characters and/or patterns at a high printing speed with high pring quality.

Referring to FIG. 6 showing a conventional LED array head, the LED array head comprises a ceramic substrate 1, printed circuits 2 formed on the ceramic substrate 1, LED array chips 3 and driving integrated circuits (hereinafter, "ICs") 4.

Each LED array chip 3 has a plurality of LEDs arranged zigzag on the surface of a strip-like chip in the longitudinal direction of the chip and insulated from each other by reverse-biased pn junctions of the LEDs instead of spatial separation of the LEDs from each other. The LED array chip 3 has a two-side electrode construction provided with individual electrodes on the upper surface of the chip and with a common electrode on the back face of the chip.

As shown in FIG. 7, the LEDs of the LED array chip 3 are bonded to the printed circuit 2 by gold wires 5 or the like, in most cases, by a wire bonding apparatus, in which wire bonding cycles have to be repeated. In the case of a LED array head of 400 DPI (dots per inch) in dot density, for instance, wire bonding cycles must be repeated for 128 LEDs (or 108 LEDs) for each LED array chip. Accordingly, in manufacturing an A4 size paper printer having 32 LED array chips, wire bonding cycles must be repeated for 4096 LEDs, which requires a considerably long time even if an automatic wire bonding machine is used.

Furthermore, since the LED array chip 3 must be provided with considerably long electrode pads 2a for wire bonding, the length of the electrode pads 2a, for example, on the order of 300 μm or 500 μm, is far greater than the length of areas 2b for the LEDs, for example, 100 μm, and hence a considerably large portion of the surface of the LED array chip 3 must be shared with the electrode pads 2a.

Thus, the conventional LED array chip requires troublesome wire bonding and must share a large portion thereof for the electrode pads.

The foregoing problems could be solved if a direct bonding process, which connects IC chips directly to an external circuit without using any wire, could be employed to connect an LED array chip to an external circuit. However, the application of the direct bonding process for such a connection requires spatial insulation of LEO array chips from each other, and the LED array chip has to possess a one-side electrode construction because only one side of the LED array chip can be brought into contact with the external circuit printed on the substrate. The conventional LED array chip is unable to meet the foregoing requirements since it has a two side electrode construction and the LEDs thereof are insulated by applying a reverse bias to the pn junctions.

SUMMARY OF THE INVENTION

Accordingly, it is an object of the present invention to solve the aforesaid disadvantages of the conventional LED array chip and to provide a novel LED array chip capable of being connected to an external circuit without requiring wire bonding.

To achieve the object of the invention, the present invention provides an LED array chip comprising LEDs spatially insulated from each other, and a semiconductor chip having a pn junction and provided with both the individual electrodes and common electrode of the LEDs on one side thereof.

A semiconductor layer having a particular type (called "first type" hereinafter) of conduction is disposed on another semiconductor layer having an opposite type (called "second type") of conduction, so as to form a semiconductor chip having a pn junction at their interface. The semiconductor layer of the second type of conduction of the semiconductor chip is divided into two regions, i.e., a first region and a second region, by a mesa-etched groove reaching the junction of the semiconductor layers. The first region is divided further into a plurality of divisions to form a plurality of individual LEDs having a predetermined shape and a predetermined area, and individual electrodes are formed respectively on the surfaces of the LEDs. The semiconductor layer of the second type of conduction in the second region is removed or the type of conduction thereof is changed to the first type of conduction to form a common region, in which a common electrode is formed. Parts of the semiconductor layer of the first type conduction which correspond to the back faces of the LEDs serve as the light emitting surface of the chip.

In assembling the LED array head, the LED array chip is bonded directly to an external circuit printed on a substrate. Accordingly, the LEDs formed on one side of the semiconductor chip provided with the individual electrodes and the common electrode are spatially insulated from each other, and hence the LEDs are not short-circuited through the surface of the substrate.

A current supplied through the common electrode formed in the common region on one side of the semiconductor chip flows into the semiconductor layer of the first type conduction in the second region directly or through the semiconductor layer of the first type conduction converted from the second type, and further into the first region through the semiconductor layer of the first type conduction continuous from the second region. Then the current flows through the pn junction and the second type conduction layer to the individual electrodes. Light emitted at the pn junction is transmitted via the semiconductor layer of the first type and is radiated from the other side of the semiconductor chip, i.e., the light emitting surface. In some cases, the current is supplied in the reverse direction.

BRIEF DESCRIPTION OF THE DRAWINGS

The above and other objects, features and advantages of the present invention will become more apparent from the following description taken in conjunction with the accompanying drawings, in which.

DESCRIPTION OF THE PREFERRED EMBODIMENTS

Figure 1:
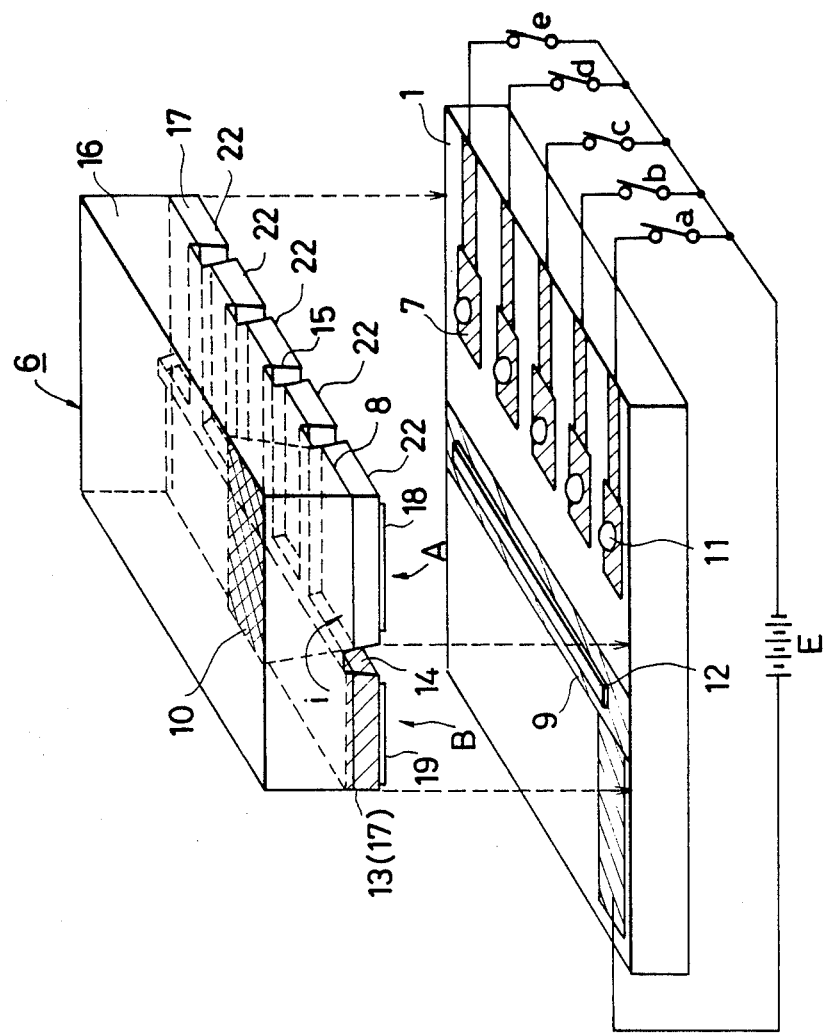
FIG. 1 is a a perspective view of an LED array chip to be disposed on a printed substrate in a preferred embodiment according to the present invention.

FIG. 1 is a perspective view of an LED array chip of assistance particularly in explaining a manner of mounting an LED array chip on a substrate. An LED array chip 6 is placed in a face-down manner on a printed circuit board 1 and is connected thereto with high dimensional accuracy without wire bonding.

The LED array chip 6 is constructed by the following procedure. An n-type As layer 17 of $(1-y)$ part Ga and y part Al $(0 \leq y < 1)$ is formed over a p-type As substrate 16 of $(1-x)$ part Ga and x part Al $(0 < x < 1, y \leq x)$ having a ratio of mixed crystal greater than that of the As layer 17 and formed by a liquid phase epitaxial growth process, so as to form an interface 8 between the p-type substrate 16 and the n-type layer 17. Since the ratio of mixed crystal of the n-type layer 17 is smaller than that of the p-type substrate 16, the forbidden band width of the n-type layer 17 is narrower than that of the p-type substrate 16. The thickness of the p-type substrate 16 is in the range of 50 to 500 $\mu$m, and the thickness of the n-type layer 17 is in the range of 1 to 30 $\mu$m.

Then, a dividing pattern is formed on the n-type layer 17 by using a photomask to divide the n-type layer 17 into two regions, and then the n-type layer 17 is etched to form a mesa isolation groove 14 reaching the interface 8 and extending longitudinally in the middle of the n-type layer 17 to divide the n-type layer 17 into a light emitting region A and a common region B. At the same time, the light emitting region A is etched to form mesa isolation grooves 15 dividing the light emitting region A widthwise into a plurality of individual rectangular LEDs 22 (in FIG. 5, five LEDs) having predetermined dimensions. Then, a common section 13 is formed to form a common electrode 19 in the common region B. A portion or all of the n-type layer 17 may be removed by etching to expose a part of the p-type substrate 16 in order to form the common section 13. In the illustrated embodiment, however, Zn is diffused or ion-implanted in the n-type layer 17 of the common region B to change the entire common region B to a Zn-diffused common region 13 by changing the type of conduction of the common region B to p-type, which is the same as the type of conduction of the substrate 16.

Then, the common electrode 19 through which a current is supplied to the LEDs 22 is formed on the surface of the common region 13, and the individual electrodes 18 through which the current supplied to the LEDs 22 flows out are formed respectively on the surfaces of the LEDs 22. The common electrode 19 and the individual electrodes 18 are formed by an evaporation process or an appropriate film forming process. To bond the LED array chip 6 to the printed wiring board 1 with improved bonding accuracy, it is desirable that the pitch between the individual electrodes 18 is substantially the same as that between the LEDs 22. Since no wire bonding process is necessary in electrically connecting the LED array chip 6 to the printed wiring board 1, electrode pads are unnecessary, and hence the area to be shared for the electrodes is comparatively small. Consequently, the ratio of the portion of the surface of the LED array chip 6 shared for the LEDs 22 to the total area of the surface of the LED array chip 6 is comparatively large. Furthermore, the common electrode 19 extends substantially over the entire common region 13. The individual electrodes 18 and the common electrodes 19 are formed of gold, aluminum, lead or an alloy containing gold, aluminum or lead as a main component.

Thus, only one surface of the LED array chip 6 is provided with grooves and electrodes, while the flat backside of the substrate 16 is exposed to form the other surface of the LED array chip 6. This LED array chip of the one-side electrode type can be formed through a simple process, which is advantageous over a LED array chip of the two-side electrode type.

The printed circuit board 1 is made from ceramics. On the board 1, individual electrode pads 7 are formed at the same pitch as that of the individual electrodes 18 of the LED array chip 6 so as to correspond respectively to the individual electrodes 18 of the LED array chip 6, and a common electrode pad 9 is formed so as to correspond to the common electrode 19 of the LED array chip 6. The individual electrode pads 7 and the common electrode pad 9 are formed by printing. Balls 11 for face-down bonding are provided respectively to the individual electrode pads 7, and leads for connecting the individual electrode pads 7 to an external circuit are extended from the individual electrode pads 7.

The common electrode pad 9 extends longitudinally on the side of the common region with respect to the center of the printed circuit board 1, and an elongate common electrode strip 12 is attached on the common electrode 9. The common electrode 19 of the LED array chip 6 is bonded to the common electrode strip 12. The common electrode pad 9 has a lead extending from the printed circuit board 1 for connection with an external circuit.

Appropriate gaps are formed between the common electrode pad and the individual electrode pads 7 on the printed wiring board 1, and between the individual electrodes 18 of the LED array chip 6 and the common electrode pad 9 and the individual electrode pads 7 of the printed wiring board so that the common electrode pad 9, the individual electrode pads 7 and the individual electrodes 18 will not be short-circuited. Bumps may be substituted for the balls 11 which are attached to the individual electrode pads 7. The balls or the bumps may be employed selectively, taking into consideration the structural relation between the printed wiring board 1 and the LED array chip 6.

The LED array chip 6 is bonded to the printed wiring board 1 thus formed in the aforesaid manner without requiring a wire bonding operation. Elimination of a wire bonding operation improves the efficiency of the chip mounting process remarkably.

As shown in FIG. 1, an external power source E is connected to the line from the common electrode pad 9 and to switches a, b, c, d and e provided in the lines extending respectively from the individual electrode pads 7. When the switch a, for example, is closed, a current i flows as indicated by an arrow from the Zn-diffused common region 13 through the p-type substrate 16, to the LED 22 connected to the switch a making the pn junction 8 of the LED 22 luminous. In this state, only a hatched area 10 (FIG. 1) in the surface of the LED array chip 6 becomes luminous. This is because the semiconductor crystal has a large refractive index and a small critical angle so that the light emitted from the interface 8 demarcated by the mesa isolation grooves 14 and 15 undergoes total reflection in areas other than the shaded area 10. Thus, a spot emission is obtained.

Figure 2:
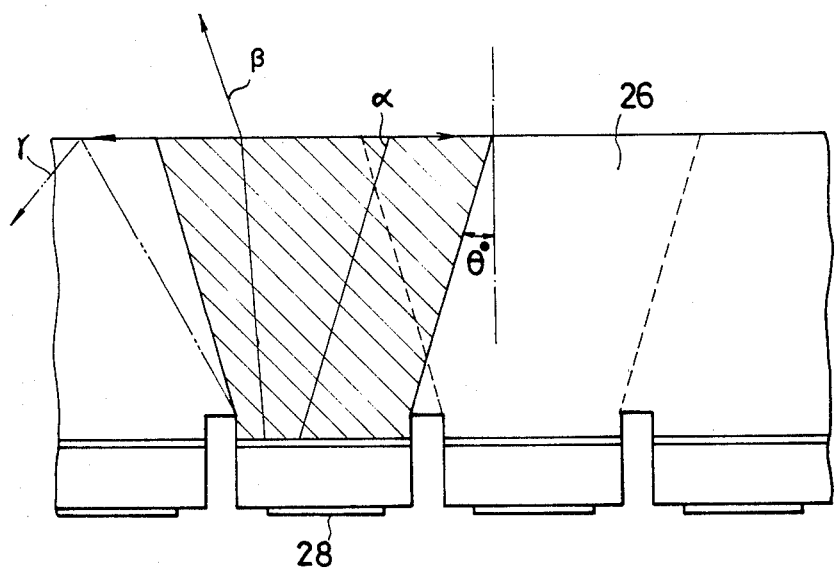
FIG. 2 is a schematic fragmentary side elevation of assistance in explaining the mode of light emission of the LED array chip of FIG. 1.
Figure 3:
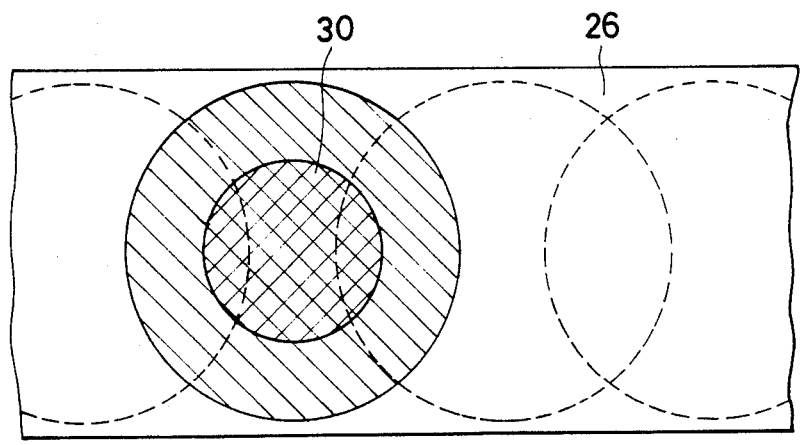
FIG. 3 is a schematic fragmentary plan view of assistance in explaining the mode of light emission of the LED array chip of FIG. 1.
Figure 4:
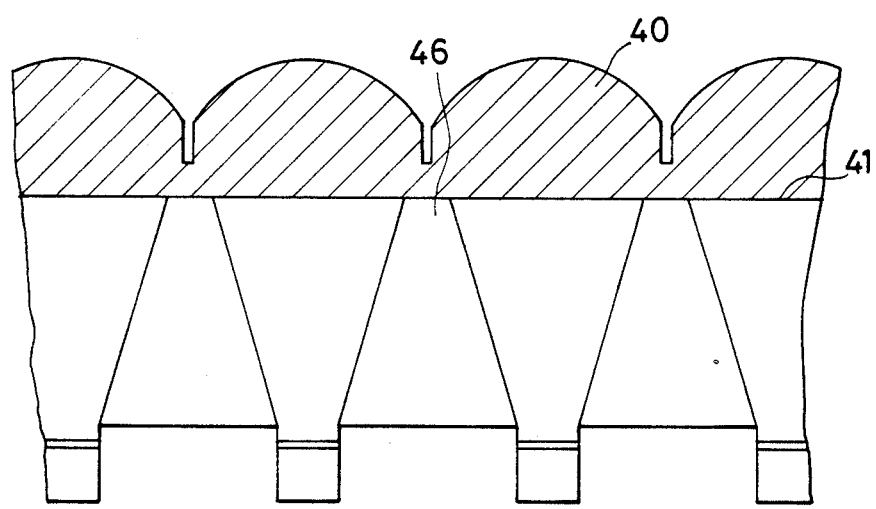
FIG. 4 is a schematic side elevation of an LED array chip in another embodiment according to the present invention, provided with convex lenses.

FIGS. 2 and 3 are illustrations of assistance in explaining such a phenomenon, in which the pattern of LEDs is a circle. For example, the refractive index of GaAs is 3.62, and that of $Ga_{0.65}Al_{0.35}$-As is 3.47. Since the critical angle $\theta = \sin^{-1}(n_2/n_1)$, $\theta_{GaAs}$ is approximately 16.0° and $\theta_{GaAlAs}$ is approximately 16.7°, when the LED array chip 26 is exposed to air. In FIG. 2, a light beam a reaches the surface exactly at the critical angle $\theta$, and then the light beam travels along the surface and is not emitted outside the surface. A light beam $\gamma$ has an angle greater than the critical angle $\theta$, and therefore it is totally reflected, and thus never penetrates the surface. Only a light beam $\beta$ which encounters the surface at an angle smaller than the critical angle $\theta$ can go outside the LED array chip 26. FIG. 3 is a top plan view of the LED array chip 26, in which a cross-hatched area 30 corresponding to an electrode 28 is most luminous and the luminous intensity decreases with distance from the cross-hatched area 30.

EXAMPLE 1

An epitaxial substrate was formed by growing a p-type $Ga_{0.65}Al_{0.35}As$ layer of approximately 200 μm in thickness and 40 mm×40 mm in size having a segregation profile of AlAs grown on a {100}GaAs substrate by a temperature gradient liquid phase epitaxial growth process employing a vertical epitaxial furnace using a rotary slide boat having two melt sumps, namely, a first melt sump for melt back and a second melt sump for growth. The epitaxial substrate was set on the substrate holder of the slide boat. An oxide film is removed from the GaAlAs surface by passing the epitaxial substrate through the first melt sump, and then the epitaxial substrate was held in contact with a growth melt in the second melt sump for ten minutes to form an n-type $Ga_{0.87}Al_{0.13}As$ layer of 5 μm in thickness on the p-type epitaxial substrate.

Then, the n-type layer was photoetched to form circular terraces of 36 μm in diameter at a pitch of 254 μm every 300 μm. The rest of the n-type layer was removed by etching the n-type layer by 6 μm in etching depth to form p-type Au/Ni/Au-Zn electrodes. Au/Ni/Au-Ge electrodes of 30 μm in diameter were formed on the circular terraces by a vapor deposition process and a photoetching process, copper base for solder is formed on the surfaces of the Au/Ni/Au-Ge electrodes by electroplating, and then the solder is accumulated on the copper base.

Then, the epitaxial substrate thus processed was cleaved in a size of 300 μm×7.62 mm to obtain a LED array chip of 100 DPI in dot density. The LED array chip was positioned on and pressed against a printed wiring board, and then the LED array chip was bonded to the printed wiring board by heating.

Since the wire bonding process is not required, the process for the LED array chip manufacturing is curtailed, and since problems attributable to defective bonding pads and problems related to the wire bonding are eleminated, an LED array chip having high reliability was obtained. In the LED array chip so obtained, the wavelength was 780 nm, the threshold voltage was 1.65 V, and the peak inverse voltage was 10 V or above. The flat surface of the LED array chip facilitates mounting operation, and provides the LED array chip with an aesthetic value.

EXAMPLE 2 (FIG. 4)

A LED array chip 46 was fabricated through the same process as described in Example 1. Then, convex lenses 40 formed by molding an epoxy resin were attached to the backside of the LED array chip 46. The convex lenses 40 suppress the diffusion of light emitted from the pn junction over the crystalline surface 41 to enhance luminous intensity, which improves the performance of the LED array chip 46 remarkably when applied to an optical printer or the like.

EXAMPLE 3 (FIG. 5)

Figure 5:
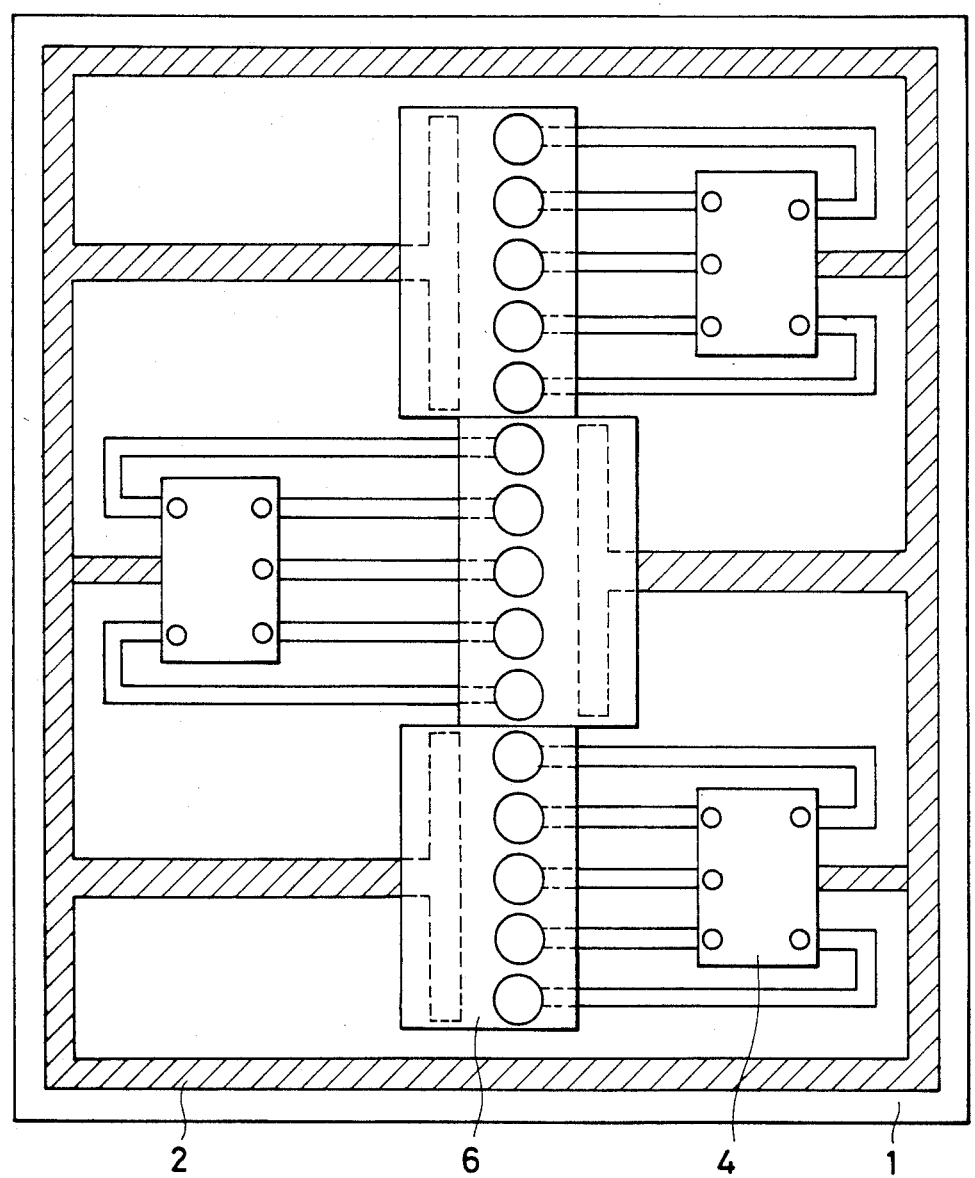
FIG. 5 is a diagrammatic illustration of an LED array head formed by assembling the LED array chip of FIG. 1 and a ceramic substrate provided with a printed circuit and driving ICs.
Figure 6:
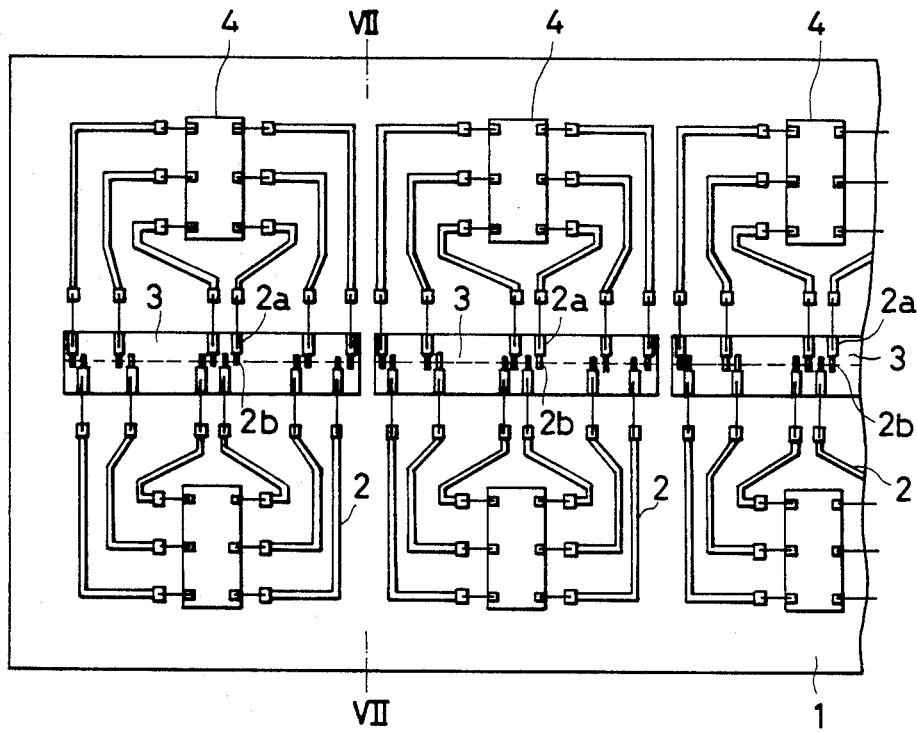
FIG. 6 is a plan view showing a conventional LED array head.
Figure 7:
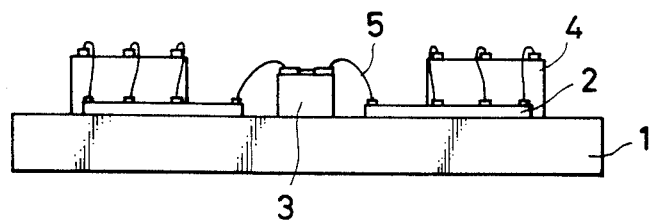
FIG. 7 is a fragmentary side elevation taken along VII—VII of FIG. 6.

FIG. 5 shows an application of the LED array chip 6 to a ceramic printed board 1 provided with IC chips 4 and a printed circuit 2. The LED array chips 6 are arranged alternately in opposite directions to facilitate connection with the corresponding driving IC chips 4. The driving IC also are attached to the ceramic substrate 1 by a face-down bonding method, which further improves the efficiency of the assembling process and the reliability of the LED array head.

Although semiconductors of GaAlAs are used for forming the LED array chips in the foregoing embodiments, semiconductors of the III–V group such as InP and semiconductors of II–VI group may used. LED array chip capable of emitting light of a desired wavelength and having a desired shape can be fabricated by selectively using appropriate materials for the LEDs.

What is claimed is:

1. An LED array chip, comprising:
    a first semiconductor layer having a first type of conduction;
    a second semiconductor layer having a second type of conduction opposite to the first type, and possessing a forbidden band width smaller than that of the first layer, the second layer being disposed on the first layer
    the second layer being divided into first and second separated regions, the first region being divided to define a plurality of individual LEDs of predetermined configuration, and the second region including a common region;
    individual electrodes respectively provided at the surfaces of the LEDs; and
    a common electrode provided in the common region, parts of the exposed surface of the first layer respectively registered with the LEDs serving as light emitting surfaces.

2. An LED array chip according to claim 1, including a circuit printed on a substrate and wherein said individual electrodes provided at said individual LEDs are bonded directly to the circuit printed on the substrate.

3. An LED array chip according to claim 1, wherein said first layer has a thickness ranging from 50 to 500 μm.

4. An LED array chip according to claim 1, wherein said second layer has a thickness of between 1 to 30 μm.

5. An LED array chip according to claim 1, wherein the center-to-center distance of said individual electrodes is substantially equal to that of said LEDs.

6. An LED array chip according to claim 1, including convex lenses disposed on the light emitting surfaces of the first layer.

7. An LED array chip according to claim 2, wherein said first layer has a thickness ranging from 50 to 500 μm.

8. An LED array chip according to claim 2, wherein said second layer has a thickness of between 1 to 30 μm.

9. An LED array chip according to claim 3, wherein said second layer has a thickness of between 1 to 30 μm.

10. An LED array chip according to claim 2, wherein the center-to-center distance of said individual electrodes is substantially equal to that of said LEDs.

11. An LED array chip according to claim 3, wherein the center-to-center distance of said individual electrodes is substantially equal to that of said LEDs.

12. An LED array chip according to claim 4, wherein the center-to-center distance of said individual electrodes is substantially equal to that of said LEDs.

13. An LED array chip according to claim 2, including convex lenses disposed on the light emitting surfaces of the first layer.

14. An LED array chip according to claim 3, including convex lenses disposed on the light emitting surfaces of the first layer.

15. An LED array chip according to claim 4, including convex lenses disposed on the light emitting surfaces of the first layer.

16. An LED array chip according to claim 5, including convex lenses disposed on the light emitting surfaces of the first layer.

17. A method of fabricating an LED array chip, comprising the steps of:
   (A) fabricating a p-type substrate;
   (B) forming on the p-type substrate an n-type layer processing a ratio of mixed crystal smaller than that of the substrate, and defining of pn junction at the interface with the substrate;
   (C) etching the n-type layer through to the pn junction so as to divide the n-type layer into a first region and a second region;
   (D) dividing the first region of the n-type layer so as to form a plurality of individual LEDs;
   (E) forming a common region in the second region of the n-type layer;
   (F) forming a common electrode in the second region; and
   (G) forming individual electrodes on the LEDs respectively.

18. A method of fabricating an LED array chip according to claim 17, wherein step (A) includes performing liquid phase epitaxial growth.

19. A method of fabricating an LED array chip according to claim 17, where step (E) includes diffusing or ion-implanting ZN into the n-type layer of the second region so as to change to n-type layer to a p-type layer.

20. A method of fabricating an LED array chip according to claim 17, wherein step (G) includes vapor deposition.

* * * * *